(12) United States Patent
Kolavi

(10) Patent No.: US 7,079,053 B2
(45) Date of Patent: Jul. 18, 2006

(54) METHOD AND SYSTEM FOR VALUE-BASED DATA COMPRESSION

(75) Inventor: Shashi Kumar M Kolavi, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 62 days.

(21) Appl. No.: 10/999,098

(22) Filed: Nov. 29, 2004

(65) Prior Publication Data

US 2006/0114131 A1 Jun. 1, 2006

(51) Int. Cl.
*H03M 7/40* (2006.01)

(52) U.S. Cl. .............................. 341/67; 341/65; 341/95
(58) Field of Classification Search ................... 341/65, 341/67, 87, 95
See application file for complete search history.

(56) References Cited

U.S. PATENT DOCUMENTS

| 5,945,933 | A | * | 8/1999 | Kalkstein | ...................... 341/63 |
| 5,990,810 | A | * | 11/1999 | Williams | ...................... 341/51 |
| 6,700,513 | B1 | * | 3/2004 | McGuire | ...................... 341/107 |
| 2002/0057715 | A1 | | 5/2002 | Hannu et al. | |

* cited by examiner

*Primary Examiner*—Peguy JeanPierre
*Assistant Examiner*—Khai Nguyen

(57) ABSTRACT

Data in a data structure is compressed by exploiting prior knowledge of the format of the data structure. A portion of the data structure is captured. A metadata component is selected for the portion. A data buffer is updated by using the selected metadata component and the captured portion. This compression technique achieves real-time data compression suitable for use with data structures used for the synchronization of the state of communication entities. The compression technique reduces the volume of data to be communicated for the synchronization of the state of communication entities and, therefore, provides faster synchronization. The present technique is suitable for use in redundant systems.

35 Claims, 9 Drawing Sheets

| Data type | Size of metadata component |
|---|---|
| BOOLEAN (BOOLEAN) | 0 bits |
| SHORT INTEGER (INT8, UINT8) | 2 bits |
| INTEGER (INT16, UINT16) | 3 bits |
| LONG INTEGER (INT32, UINT32) | 4 bits |
| DOUBLE (INT64, UINT64) | 5 bits |

FIG. 4

| Data Type | Size of metadata component | Data Value Sub-Range (binary) | | Associated Metadata component |
|---|---|---|---|---|
| | | From | To | |
| BOOLEAN | 0 | 0 | 1 | - NA - |
| SHORT INTEGER | 2 | 0000 0000 | 0000 0011 | 00 |
| | | 0000 0100 | 0000 1111 | 01 |
| | | 0001 0000 | 0011 1111 | 10 |
| | | 0100 0000 | 1111 1111 | 11 |
| INTEGER | 3 | 0000 0000 0000 0000 | 0000 0000 0000 0011 | 000 |
| | | 0000 0000 0000 0100 | 0000 0000 0000 1111 | 001 |
| | | 0000 0000 0001 0000 | 0000 0000 0011 1111 | 010 |
| | | 0000 0000 0100 0000 | 0000 0000 1111 1111 | 011 |
| | | 0000 0001 0000 0000 | 0000 0011 1111 1111 | 100 |
| | | 0000 0100 0000 0000 | 0000 1111 1111 1111 | 101 |
| | | 0001 0000 0000 0000 | 0011 1111 1111 1111 | 110 |
| | | 0100 0000 0000 0000 | 1111 1111 1111 1111 | 111 |

FIG. 5

METHOD AND SYSTEM FOR VALUE-BASED DATA COMPRESSION

TECHNICAL FIELD OF THE INVENTION

The present invention relates to value-based data compression suitable for use in data communication systems. For example, the present invention relates to the compression of data structures that can be used in redundant systems.

BACKGROUND OF THE INVENTION

Fault-tolerant systems using redundancy (hereinafter referred to as redundant systems) are utilized in enterprises today to enhance the reliability of data storage. The underlying concept of redundancy is to maintain multiple copies of data on one or more redundant servers. Therefore, if one redundant server, or the network used to access the redundant server, experiences a fault, the data is still accessible from one of the remaining redundant servers.

The maintenance of multiple copies of the data on the redundant servers requires synchronization of the state of the redundant servers. Therefore, changes made to the data on one redundant server must be reflected on all other redundant servers. This redundancy allows access to the changed data, irrespective of which redundant server experiences a fault. The redundant servers communicate over a synchronization path to exchange data for synchronization (hereinafter referred to as synchronization data). The synchronization path has two types: public path and private path.

The public path is a network that is publicly accessible and is used for a variety of applications apart from synchronization. An example of a public path is a local area network (LAN). On the other hand, the private path is always a dedicated network, used only for the purpose of synchronization. In certain redundant systems, a combination of public and private paths is used for synchronization.

The time required to perform synchronization (hereinafter referred to as synchronization time) is one of the key performance factors of the redundant system. However, a long synchronization time is often due to a slow synchronization path. The use of dedicated private paths reduces this synchronization time because dedicated private paths are usually faster than public paths, which are shared by many users. However, with increasingly larger volumes of data being stored on redundant servers, there is a need to further reduce synchronization time.

A reduction in the synchronization time can be achieved by compressing the synchronization data. Compression of the synchronization data leads to a reduction in the volume of data to be transferred over the slow synchronization path, which reduces synchronization time. Since the servers known in the art have a high computational capacity, the additional computational cost of the compression algorithms running on the redundant servers is acceptable in most redundant systems.

A number of data compression techniques are known in the art. For example, compression techniques known as dictionary based compression techniques are used to compress the data transmitted over data communication networks. Dictionary based compression techniques replace phrases with tokens. If the number of bits in the token is less than the number of bits in the phrase, compression occurs.

The compression ratio achieved by a data compression technique depends largely on the type of data being compressed. Synchronization data has inherent redundancies which are not considered by these known compression techniques. Therefore, the compression ratio achieved by these algorithms for synchronization data is not optimal.

The present invention overcomes these and/or other problems.

SUMMARY OF THE INVENTION

According to one aspect of the present invention, a method is provided to communicate data structures among communication entities of a data communication system. The data structures comprise at least one data element. The method comprises the following: capturing a current value of the data element pertaining to at least a portion thereof; encoding the data element by selecting a metadata component characterizing the data element to enable data compression; updating a data buffer using the metadata component and the portion; repeating the capturing, the encoding, and the updating for all of the data elements in the data structure; communicating the data buffer to at least one receiving communication entity in the data communication system; analyzing the metadata component associated with an encoded data element in the data buffer to obtain a size of the portion; extracting the portion from the data buffer using the size; reconstructing the data element from the portion by matching the size of the portion of the data element to the size of the data element; and, repeating the analyzing, the extracting and the reconstructing for all of the encoded data elements in the data buffer.

According to another aspect of the present invention, a method is provided to compress a data structure comprising at least one data element to obtain a data buffer representing the data structure. The method comprises the following: capturing a current value of the data element pertaining to at least a portion thereof; encoding the data element by selecting a metadata component characterizing the data element to enable data compression; updating the data buffer using the metadata component and the portion; and, repeating the capturing, the encoding and the updating for all of the data elements in the data structure.

According to yet another aspect of the present invention, a method is provided to decompress a data buffer representing a data structure to obtain the data structure. The data buffer comprises at least one encoded data element, and each encoded data element represents a data element of the data structure, The method comprises the following: analyzing a metadata component associated with an encoded data element in the data buffer to obtain a size of a portion of the data element represented by the encoded data element; extracting the portion from the data buffer by using the size; reconstructing the data element from the portion by matching the size of the portion of the data element to the size of the data element; and, repeating the analyzing, the extracting and the reconstructing for all of the encoded data elements in the data buffer.

According to still another aspect of the present invention, a method is provided to communicate data structures in a compressed format for synchronization of the state of communication entities in a data communication system. The data structures comprising at least one data element, the method comprises the following: capturing a current value of the data element by discarding one or more pairs of adjacent zero bits, if any, that occupy bit positions more significant than the most significant non-zero bit of the data element and by retaining the remaining bits of the data element to obtain a portion; selecting a size of a metadata component based on the metadata component associated with a data type of the data element; identifying a range of data element values from a predefined set of ranges of data element values pertaining to the data type of the data element, wherein the current value of the data element lies within the range; selecting a predefined metadata value associated with the identified range as the metadata component value; concatenating the metadata component and the portion to the data buffer; repeating the capturing, the selecting, the identifying, the selecting, and the concatenating for all of the data elements in the data structure; communicating the data buffer to at least one receiving communication entity in the data communication system; analyzing the metadata component associated with an encoded data element in the data buffer to obtain a size of the portion; extracting the portion from the data buffer using the size of the portion; prefixing zeros to the portion to match a size thereof to the size of the data element; repeating the analyzing, the extracting, and the prefixing for all of the data elements in the data buffer to reproduce a data structure; and, synchronizing the state of the receiving communication entity to the state of a communication entity that communicated the data buffer based on the reproduced data structure.

According to a further aspect of the present invention, a system is provided to communicate data structures in a compressed format for synchronization of the state of communication entities in a data communication system. The data structures comprise at least one data element. The system comprises a current value capturing block, an encoding block, a data buffer updating block, a communicating block, a metadata component analyzing block, a portion extracting block, a data element reconstructing block, and a synchronizing block. The current value capturing block captures a current value of the data element pertaining to at least one portion thereof, wherein the current value capturing block is adapted to reside in at least one communication entity. The encoding block encodes the data element by selecting a metadata component characterizing the data element to enable data compression, wherein the encoding block is adapted to reside in at least one communication entity. The data buffer updating block updates a data buffer using the metadata component and the portion, wherein the data buffer updating block is adapted to reside in at least one communication entity. The communicating block communicates the data buffer to at least one communication entity in the data communication system, wherein the communicating block is adapted to reside in at least one communication entity. The metadata component analyzing block analyzes the metadata component associated with an encoded data element in the data buffer to obtain a size of the portion, wherein the metadata component analyzing block is adapted to reside in at least one communication entity. The portion extracting block extracts the portion from the data buffer using the size of the portion, wherein the portion extracting block is adapted to reside in at least one communication entity. The data element reconstructing block reconstructs the data element from the portion by matching size of the portion of the data element to the size of the data element, wherein the data element reconstructing block is adapted to reside in at least one communication entity. The synchronizing block synchronizes the state of at least one communication entity using the reconstructed data element.

According to yet a further aspect of the present invention, a system for compressing a data structure comprising at least one data element to obtain a data buffer representing the data structure comprises a current value capturing block, a data element encoding block, and a data buffer updating block. The current value capturing block captures a current value of the data element pertaining to at least one portion thereof, wherein the current value capturing block is adapted to reside in at least one communication entity. The data element encoding block encodes the data element by selecting a metadata component characterizing the data element to enable data compression, wherein the data element encoding block is adapted to reside in at least one communication entity. The data buffer updating block updates the data buffer using the metadata component and the portion, wherein the data buffer updating block is adapted to reside in at least one communication entity.

According to still a further aspect of the present invention, a system is provided to decompress a data buffer representing a data structure to obtain the data structure. The data buffer comprises at least one encoded data element, and each encoded data element represents a data element of the data structure. The system comprises a metadata component analyzing block, a data element extracting block, and data element reconstructing block. The metadata component analyzing block analyzes a metadata component associated with an encoded data element in the data buffer to obtain a size of a portion of the data element represented by the encoded data element, wherein the metadata component analyzing block is adapted to reside in at least one communication entity. The data element extracting block extracts the portion of the data element from the data buffer using the size, wherein the data element extracting block is adapted to reside in at least one communication entity. The data element reconstructing block reconstructs the data element from the portion by matching size of the portion of the data element to the size of the data element, wherein the data element reconstructing block is adapted to reside in at least one communication entity.

According to another aspect of the present invention, a computer readable medium has program stored thereon code such that, when the program code is executed, data structures are communicated in a compressed format to a communication entity in a data communication system, and the data structures comprise at least one data element. The program code comprises first, second, third, and fourth program code. The first program code captures a current value of the data element pertaining to at least one portion thereof. The second program code encodes the data element by selecting a metadata component characterizing the data element to enable data compression. The third program code updates a data buffer using the metadata component and the portion. The fourth program code communicates the data buffer to at least one receiving communication entity in the data communication system.

According to yet another aspect of the present invention, a computer readable medium has program stored thereon code. The program code, when executed, decompresses a data buffer corresponding to a data structure in a compressed format, and the data buffer comprises a portion of a data element of the data structure and a metadata component corresponding to the portion. The program code comprises first, second, and third program code. The first program code analyzes the metadata component associated with the portion to obtain a size of the portion. The second program code extracts the portion from the data buffer using the size of the portion. The third program code reconstructs the data element from the portion by matching size of the portion of the data element to the size of the data element.

BRIEF DESCRIPTION OF THE DRAWINGS

The present invention will hereinafter be described in conjunction with the appended drawings provided to illustrate and not to limit the present invention, wherein like designations denote like elements, and in which:

FIG. 4 is a table listing exemplary sizes of the metadata component for various data types;

FIG. 5 is a table depicting an exemplary division of the ranges of some commonly used data types;

DETAILED DESCRIPTION

Fault tolerant systems often employ one or more back up computers that maintain the same set of data as is maintained by the main computer. Thus, if the main computer fails to adequately perform its functions, the user can be switched over to a back up computer without any loss of functionality. Maintaining the same set of data on the back up computer is sometimes referred to as synchronization.

Traditionally, fault tolerant systems perform synchronization using a public path or a private path. The time required for performing synchronization increases as the synchronization data increases. The compression technique of the present invention is suitable for compressing data structures such as those used in synchronization. According to one embodiment of the present invention, compression is achieved by using only a portion of a data element for encoding. Further, a metadata component is added the portion in order to facilitate decompression of the encoded data. In applications such as the synchronization of data communication systems, prior knowledge of the data structures comprising the synchronization data is present at each communication entity. The present technique exploits this prior knowledge of the data structure in order to achieve compression.

Figure 1A:
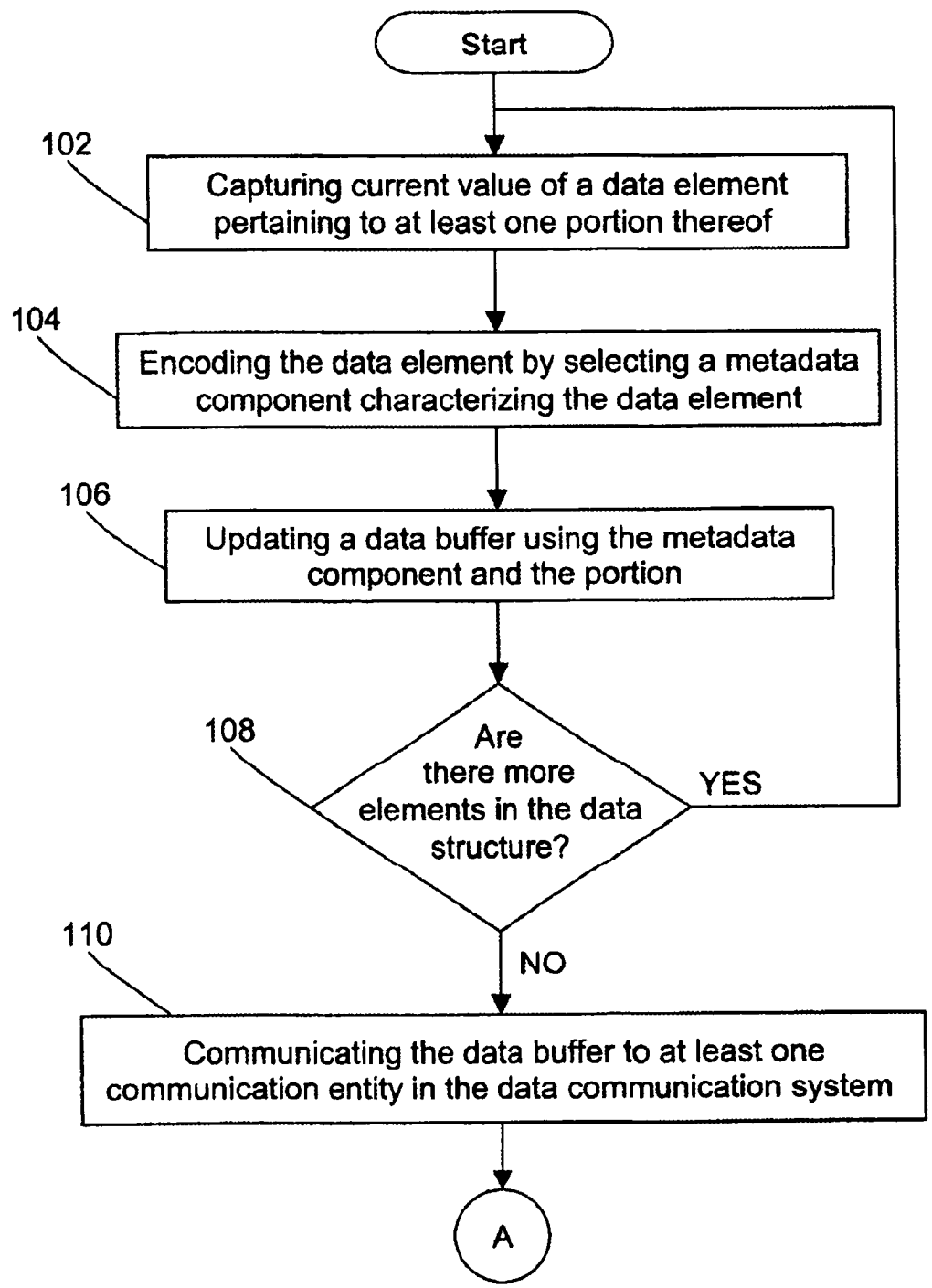
FIGS. 1A and 1B show a flowchart depicting a method of communicating a data structure in compressed format according to an embodiment of the present invention.
Figure 1B:
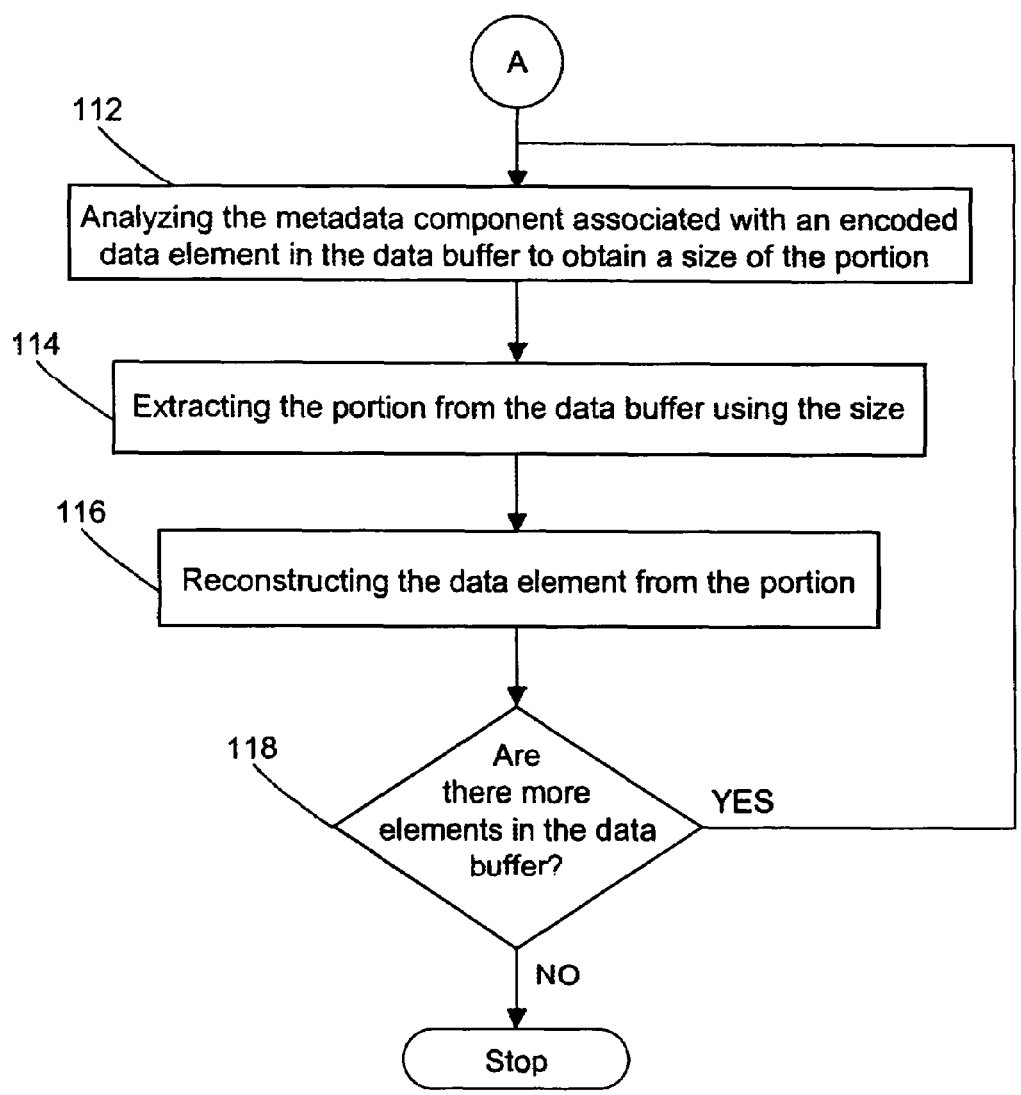

As shown in FIG. 1A and FIG. 1B, a flowchart depicts a method of communicating a data structure according to an embodiment of the present invention. The steps of FIG. 1A are executed by a transmitting communication entity, and the steps of FIG. 1B are executed by a receiving communication entity.

According to the method, the data structure is compressed to obtain a data buffer representing the data structure. The data buffer is communicated from one communication entity in the data communication system to at least one other communication entity. The receiving communication entity decompresses the data buffer to recover the data structure. According to the method, each data structure is divided into one or more data elements, and each data element is independently considered for compression.

At a step 102, the current value of a data element of the data structure is captured, and a portion of the data element is obtained, wherein the portion represents the value of the data element. Then, at a step 104, the data element is encoded by selecting a metadata component that characterizes the data element. This encoding step 104 is described further with reference to FIG. 2. At a step 106, the data buffer is updated by using the metadata component and the data element portion. At a step 108, a determination is made as to whether there are more data elements in the data structure that have not been considered for compression. If there are more such data elements in the data structure, the method loops back to perform steps 102, 104, and 106 for each of the remaining data elements. Once all the data elements in the data structure have been considered for compression, the data buffer, at a step 110, is communicated by the transmitting communication entity to at least one receiving communication entity in the data communication system.

Thereafter, the remaining method of FIG. 1B executes at the communication entity that receives the data buffer. At a step 112, the metadata component associated with a data element encoded in the data buffer is analyzed to obtain the size of the portion of the data element contained in the data buffer. At a step 114, the size thus obtained is used to extract the portion of the data element from the data buffer. Finally, at a step 116, the data element is reconstructed from the portion extracted at the step 114 by matching the size of the extracted portion to the size of the data element given by the metadata component, thereby enabling decompression. At a step 118, a determination is made as to whether there are more encoded data elements encoded in the data buffer that have not been considered for decompression. If there are more such encoded data elements in the data buffer, the method loops back to perform the steps 112, 114, and 116 for each of the remaining encoded data elements. Thus, the data structure is obtained at the communication entity receiving the data buffer.

In an embodiment of the present invention, the data type of each data element in the data structure is known to the communication entity receiving the data buffer prior to the method execution. In another embodiment, the data type of each data element in the data structure is communicated to the communication entity receiving the data buffer by another communication entity, prior to the method execution. For example, before a data buffer is communicated from the transmitting communication entity to the receiving communication entity, the transmitting communication entity transmits header information to the communication entity. The header information indicates how much data will be sent in data buffer. Once the header information is transmitted, the data buffer is transmitted. Thus, depending on the header, the receiving communication entity will understand the type and amount of data in the data buffer.

Figure 2:
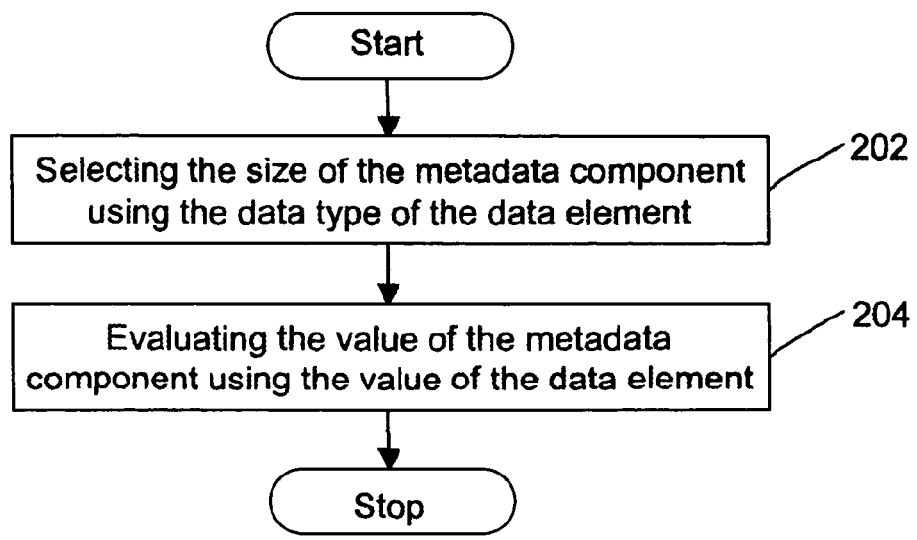
FIG. 2 is a flowchart showing the encoding step of FIG. 1 in additional detail.

FIG. 2 shows a method of encoding a data element by selecting a metadata component characterizing the data element. At a step 202, the data type of the data element is used to select the size of the metadata component. FIG. 4 is a table 402 that shows examples of data types and the sizes of corresponding metadata components. The data type of the data element could be one of a plurality of known data types. The present technique associates a distinct size of the metadata component with each of the known data types. This association is further explained with reference to FIG.

3. At the step 202, the size of the metadata component associated with the data type of the data element under consideration is selected.

At a step 204, the value of the metadata component is evaluated by using the value of the data element. This step is further described with reference to FIG. 3.

Figure 3:
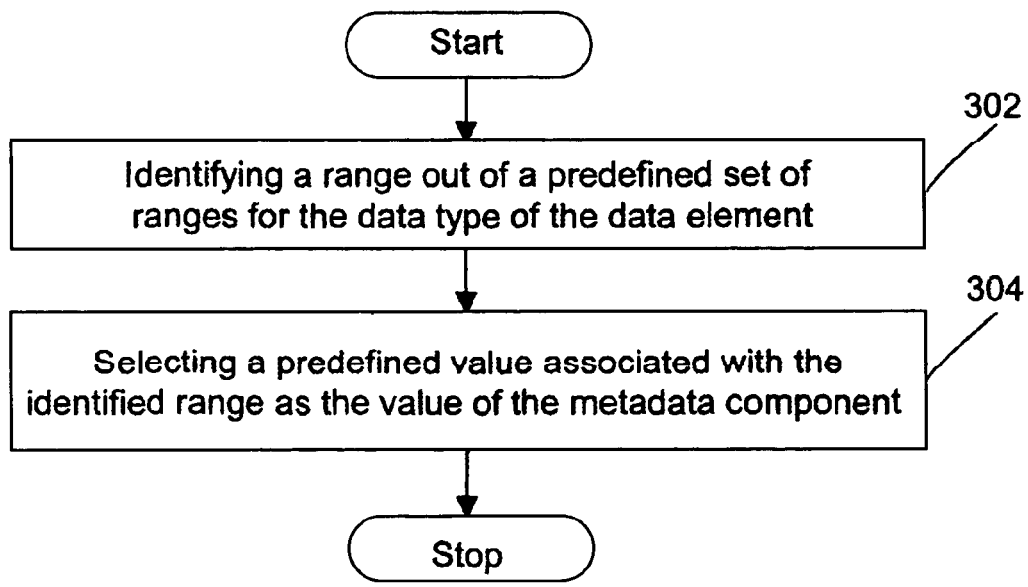
FIG. 3 is a flowchart expanding on the flowchart of FIG. 21 to depict a method of evaluating the value of the metadata component.

FIG. 3 shows a method of evaluating the value of the metadata component. To select the value of the metadata component, the range of each data type is divided into a predefined set of ranges. An example of the ranges of some commonly used data types is presented with reference to a table 502 of FIG. 5. At a step 302, one range from the predefined set of ranges is identified by using the value of the data element. That is, the range in which the value of the data element lies is identified. At a step 304, a predefined value associated with the identified range is selected as the value of the metadata component.

The table 402 shown in FIG. 4, includes an example of the sizes of the metadata component for various data types. The table 402 contains a data type column 404 in which examples of data types considered for compression are listed. Further, a size of metadata component column 406 shows an example of the size of a metadata components for each of the data types in the data type column 404.

For example, a row 408 of the table 402 shows that a metadata component of O-bits is used for the BOOLEAN data type. A row 410 shows that a metadata component of 2-bits is used for the SHORT INTEGER (INT8 or UINT8) data type, where INT8 denotes a signed 8-bit integer and UINT8 denotes an unsigned 8-bit integer. A row 412 shows that a metadata component of 3-bits is used for the INTEGER (INT16 or UINT16) data type, where INT16 denotes a signed 16-bit integer and UINT16 denotes an unsigned 16-bit integer. A row 414 shows that a metadata component of 4-bits is used for the LONG INTEGER (INT32 or UINT32) data type, where INT32 denotes a signed 32-bit integer and UINT32 denotes an unsigned 32-bit integer. A row 416 shows that a metadata component of 5-bits is used for the DOUBLE (INT64 or UINT64) data type, where INT64 denotes a signed 64-bit integer and UINT64 denotes an unsigned 64-bit integer.

It will be apparent to one skilled in the art that other sizes of the metadata component may be selected for these data types without deviating from the spirit and scope of the present technique. Further, additional data types not listed in table 402 and/or alternative data types may be considered for compression by associating a metadata component size to each such additional and/or alternative data type.

The table 502 shown in FIG. 5 depicts an example of a division of the ranges of some commonly used data types. The table 502 contains a data type column 504, a size of metadata component column 506, a data value sub-range column 508, and an associated metadata component column 510. A row 512 of the table 502 shows that a metadata component of O-bits is selected for the data type BOOLEAN. The range $(0)_2$ to $(1)_2$ of data type BOOLEAN does not have a metadata component associated with it, where $(\ )_2$ denotes the binary notation of the number. Further, rows 514 of the table 502 show that a metadata component of 2-bits is selected for the data type SHORT INTEGER. For example, the range $(0000\ 0000)_2$ to $(0000\ 0011)_2$ of the data type SHORT INTEGER has $(00)_2$ as its associated metadata component. Similarly, rows 516 of the table 502 show that a metadata component of 3-bits is selected for the data type INTEGER. For example, the range $(0000\ 0000\ 0000\ 0000)_2$ to $(0000\ 0000\ 0000\ 0011)_2$ of the data type INTEGER has $(000)_2$ as its associated metadata component. Other sub-ranges of the entire range of the data types shown in table 502, and their associated metadata components, are shown in FIG. 5. It will be apparent to someone skilled in the art that various other sub-ranges of the data types shown can be used without deviating from the spirit and scope of the present technique. Furthermore, the ranges of various other data types besides those shown in FIG. 5 can be split into sub-ranges and each of these sub-ranges can be associated with various metadata component values without deviating from the spirit and scope of the present technique.

Figure 6:
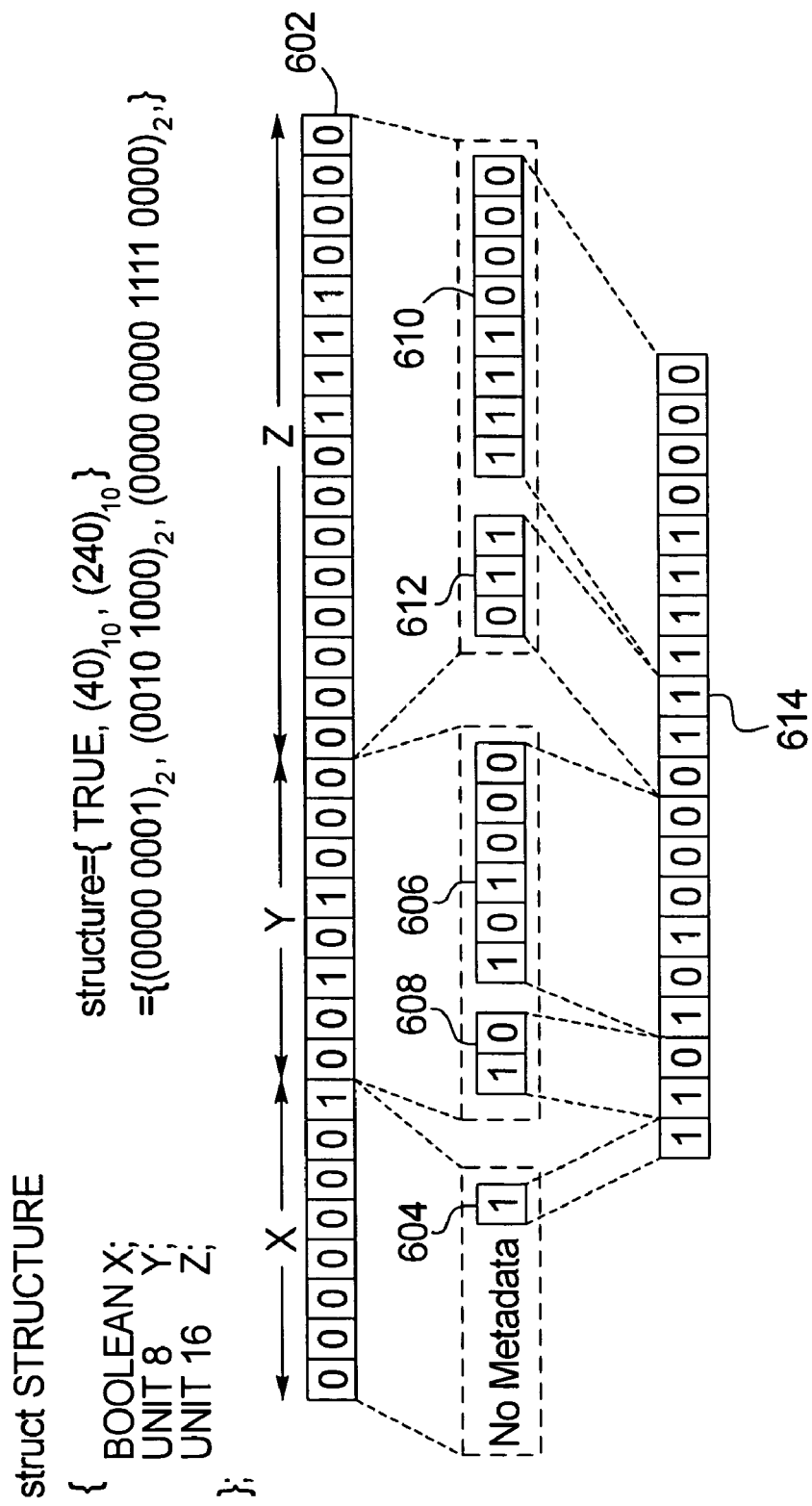
FIG. 6 depicts the compression of an exemplary data structure to illustrate the value based compression technique according to an embodiment of the present invention.

FIG. 6 shows the compression of an exemplary data structure. FIG. 6 shows a data structure STRUCTURE, comprising a BOOLEAN data element X, a UINT8 data element Y, and a UINT16 data element Z. As indicated above, a header may be transmitted by the transmitting communication entity to the receiving communication entity to notify the receiving communication entity that it can expect to receive a data buffer containing a compressed form of a data structure comprising a BOOLEAN data element, a UINT8 data element, and a UINT16 data element. Alternatively, the receiving communication entity may otherwise know a priori that the received data buffer contains a compressed form of the data structure comprising a BOOLEAN data element, a UINT8 data element, and a UINT16 data element.

An instance of the data structure STRUCTURE, instance structure, is shown to have values of the data elements as follows: structure.X equals TRUE, structure.Y equals $(40)_{10}$, and structure.Z equals $(240)_{10}$, where $(\ )_{10}$ denotes the decimal notation of a number. Therefore, in the binary form, structure=$\{(0000\ 0001)_2, (0010\ 1000)_2, (0000\ 0000\ 1111\ 0000)_2\}$.

The binary representation of the instance structure is shown as 602. The instance structure is compressed as shown in FIGS. 1A, 1B, 2, and 3. That is, at the step 102, a portion of the structure.X is selected. Because the data type for the structure.X is BOOLEAN, this selection is done by selecting only the least significant bit of the structure.X and discarding all other bits of the structure.X to obtain a first portion 604.

At the step 104, the metadata component is selected for the structure.X. Accordingly, at the step 202, the size of the metadata component for the corresponding data type is retrieved from the table 402. For data type BOOLEAN, the size of the metadata component is equal to 0 bits. In other words, the data type BOOLEAN requires no metadata component. At the step 108, a determination is made as to whether there are more data elements in the structure which have not been considered for compression. At this step, the data elements structure.Y and structure.Z are identified as requiring consideration, and flow returns to the step 102 in order to compress the data element structure.Y.

At the step 102, a portion of the structure.Y is selected. This selection is based on data type and range. For example, for the data type SHORT INTEGER and the range $(0000\ 0000)_2$ to $(0000\ 0011)_2$, the two least significant bits are selected and all other bits are discarded; for the range $(0000\ 0100)_2$ to $(0000\ 1111)_2$, the four least significant bits are selected and all other bits are discarded; for the range $(0001\ 0000)_2$ to $(0011\ 1111)_2$, the six least significant bits are selected and all other bits are discarded; and, for the range $(0100\ 0000)_2$ to $(1111\ 1111)_2$, all bits are selected and no bits are discarded. As can be seen, only zero bits are discarded.

Accordingly, a metadata component of $(00)_2$ indicates that the following data portion in the data buffer contains only two bits of the corresponding data element, a metadata component of $(01)_2$ indicates that the following data portion in the data buffer contains only four bits of the corresponding data element, a metadata component of $(10)_2$ indicates that the following data portion in the data buffer contains only six bits of the corresponding data element, and a metadata component of $(11)_2$ indicates that the following data portion in the data buffer contains all eight bits of the corresponding data element.

As shown in FIG. 6, the structure.Y is $(0010\ 1000)_2$ and, therefore, only the two most significant bits are discarded and the six least significant bits are selected to obtain a second portion 606. At the step 104, the metadata component is selected for the structure.Y. Accordingly, at the step 202, the size of the metadata component for the data type is retrieved from the table 402. For the data type UINT8, the size of the corresponding metadata component is equal to 2 bits. At the step 204, the value of the metadata component is evaluated for the structure.Y. For this evaluation, the table 502 is considered, and the value of the metadata component 608 is evaluated as $(10)_2$.

For the data type INTEGER and the range $(0000\ 0000\ 0000\ 0000)_2$ to $(0000\ 0000\ 0000\ 0011)_2$, the two least significant bits are selected and all other bits are discarded; for the range $(0000\ 0000\ 0000\ 0100)_2$ to $(0000\ 0000\ 0000\ 1111)_2$, the four least significant bits are selected and all other bits are discarded; for the range $(0000\ 0000\ 0001\ 0000)_2$ to $(0000\ 0000\ 0011\ 1111)_2$, the six least significant bits are selected and all other bits are discarded; for the range $(0000\ 0000\ 0100\ 0000)_2$ to $(0000\ 0000\ 1111\ 1111)_2$, the eight least significant bits are selected and all other bits are discarded; for the range $(0000\ 0001\ 0000\ 0000)_2$ to $(0000\ 0011\ 1111\ 1111)_2$, the ten least significant bits are selected and all other bits are discarded; for the range $(0000\ 0100\ 0000\ 0000)_2$ to $(0000\ 1111\ 1111\ 1111)_2$, the twelve least significant bits are selected and all other bits are discarded; for the range $(0001\ 0000\ 0000\ 0000)_2$ to $(0011\ 1111\ 1111\ 1111)_2$, the fourteen least significant bits are selected and all other bits are discarded; and, for the range $(0100\ 0000\ 0000\ 0000)_2$ to $(1111\ 1111\ 1111\ 1111)_2$, all bits are selected and no bits are discarded. As can be seen again, only zero bits are discarded.

Accordingly, a metadata component of $(000)_2$ indicates that the following data portion in the data buffer contains only two bits of the corresponding data element, a metadata component of $(001)_2$ indicates that the following data portion in the data buffer contains only four bits of the corresponding data element, a metadata component of $(010)_2$ indicates that the following data portion in the data buffer contains only six bits of the corresponding data element, a metadata component of $(011)_2$ indicates that the following data portion in the data buffer contains all eight bits of the corresponding data element, a metadata component of $(100)_2$ indicates that the following data portion in the data buffer contains only ten bits of the corresponding data element, a metadata component of $(101)_2$ indicates that the following data portion in the data buffer contains only twelve bits of the corresponding data element, a metadata component of $(110)_2$ indicates that the following data portion in the data buffer contains only fourteen bits of the corresponding data element, and a metadata component of $(111)_2$ indicates that the following data portion in the data buffer contains all sixteen bits of the corresponding data element.

Therefore, for the structure.Z shown in FIG. 6, a portion 610 is selected as $(1111\ 0000)_2$ and a metadata value 612 is selected as $(011)_2$.

A data buffer 614 is obtained by concatenating, in order, 604, 608, 606, 612 and 610.

Figure 7:
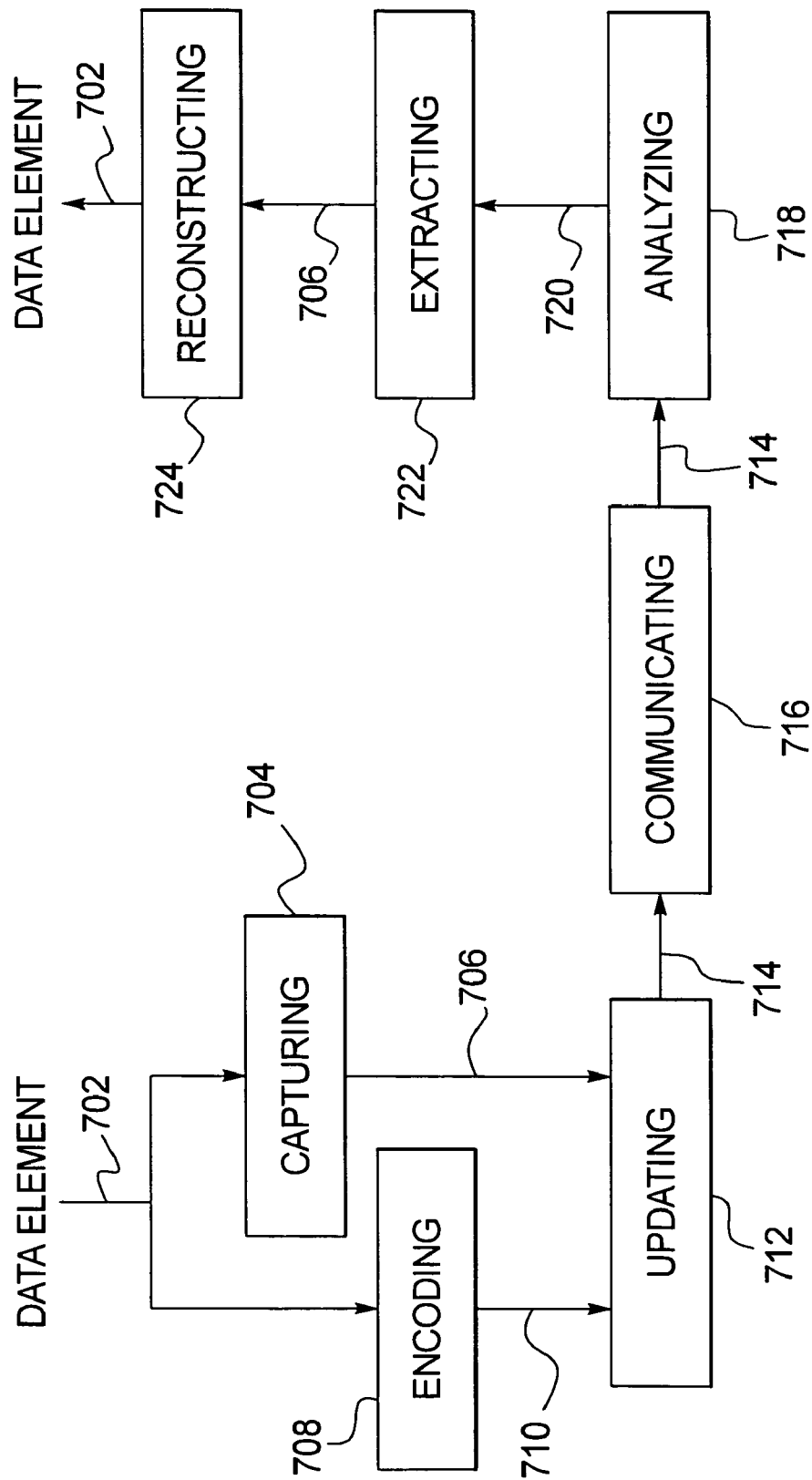
FIG. 7 is a block diagram of a system for communicating a data structure in compressed format in accordance with an embodiment of the present invention.

Shown in FIG. 7 is an functional block diagram of an example of a system for communicating data structures in a compressed format from a transmitting communication entity to a receiving communication entity. Each data element of the data structure is fed to the system shown in FIG. 7. Accordingly, in the transmitting communication entity, a data element 702 is fed to a capturing block 704 which captures a portion 706 of data element 702. In an embodiment, the capturing block 702 captures the portion 706 by retaining the number of least significant bits indicated by its range and data type and by discarding all other bits. As noted above, only zero bits are discarded.

The data element 702 is also fed to an encoding block 708. The encoding block 708 selects a metadata component 710 characterizing the data element 702 to enable data compression. The encoding block 708 is further described by way of example with reference to FIG. 8. As shown in FIG. 7, the metadata component 710 and the portion 706 are fed to an updating block 712. The updating block 712 updates a data buffer 714 by concatenating the metadata components and portions obtained for each data element of the data structure. Thus, the data buffer 714 represents the compressed form of the data structure.

The transmitting communication entity communicates the data buffer 714 to a receiving communication entity by use of a communicating block 716. In various embodiments, the communication block 716 could be, but is not limited to, a Local Area Network (LAN), a Wide Area Network (WAN), or the Internet.

At a receiving communication entity, the received data buffer 714 is fed to an analyzing block 718, which analyzes the metadata component 710 associated with the data element 702 encoded in the data buffer 714 to obtain a size 720 of the portion 706. As discussed above, if the data type if SHORT INTEGER and if the metadata component is $(00)_2$, the size of the portion 706 following the metadata component is two bits, if the metadata component is $(01)_2$, the size of the portion 706 following the metadata component is four bits, if the metadata component is $(10)_2$, the size of the portion 706 following the metadata component is six bits, and if the metadata component is $(11)\ 2$, the size of the portion 706 following the metadata component is eight bits. The size 720 is fed to an extracting block 722, which extracts the portion 706 out of the received data buffer 714. The extracted portion 706 is fed to a reconstructing block 724, which reconstructs the data element 702 from the portion 706 by matching the size of the portion 706 to the size of the data element 702.

For example, when the receiving communication entity receives the metadata component 608 and the data portion 606 of FIG. 6, the metadata component 608 have a value of $(10)_2$ indicates that there are six bits of data in the data portion 606. Therefore, reconstructing block 724 reconstructs the structure.Y by adding two zeros in the most significant bit positions of the data portion 606 to produce the data element $(0010\ 1000)_2$.

The capturing block 704, the encoding block 708, the updating block 712, the communication block 716, the analyzing block 718, the extracting block 722, and the reconstructing block 724 can each be implemented in software and/or in hardware. Various other forms of implementation of these blocks would be apparent to one skilled in the art.

Figure 8:
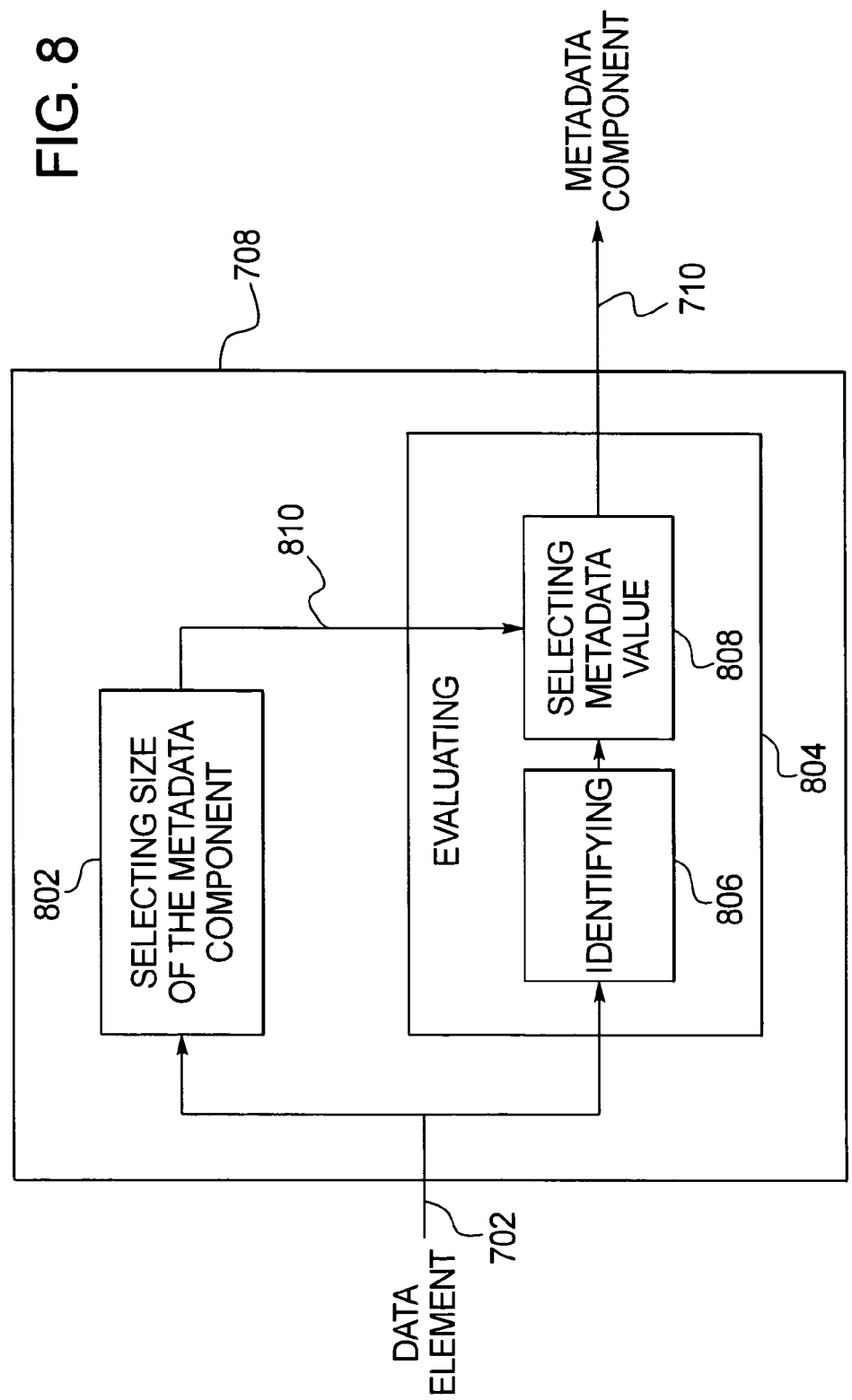
FIG. 8 is a block diagram of an encoder according to an embodiment of the present invention; and, FIG. 9 is a block diagram of a synchronization portion of a receiving communication entity.

As shown in FIG. 8, the encoding block 708 includes a metadata size selection block 802 and an evaluating block 804. The evaluating block 804 further includes an identifying block 806 and a metadata value selection block 808. The data element 702 is fed to the metadata size selection block 802, which selects a size 810 of the metadata component associated with the data type of the data element 702. The metadata size selection block 802 can be implemented using a look-up table, such as the table 402. Further, the data element 702 is also fed to identifying block 806, which identifies the sub-range into which the current value of the data element 702 falls. Based on the selected sub-range, and the size 810, the metadata value selection block 808 selects the metadata component 710 by using the table 502.

Figure 9:
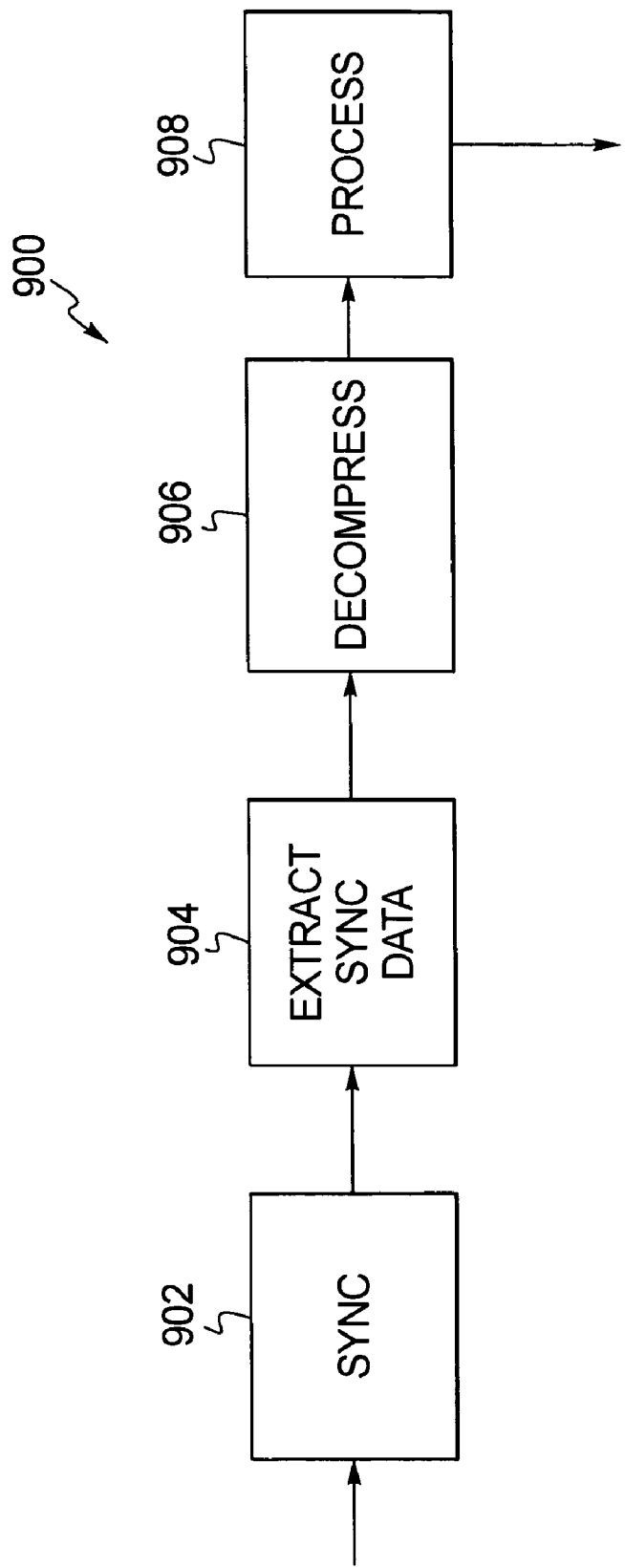

FIG. 9 shows an example of a receiving communication entity 900 that can implement the present invention. A synchronization block 902 indicates that the data of the receiving communication entity 900 is to be synchronized to the data of a transmitting communication entity, i.e., that the set of data to be stored by the receiving communication entity 900 is to be the same as the set of data stored by the transmitting communication entity 900. The data of the receiving communication entity 900 includes a data extraction block 904, a data decompression block 906, and a processing block 908. The data extraction block 904 extracts a data buffer from a received signal which might also contain, for example, a header for each data buffer transmitted by the transmitting communication entity to the receiving communication entity 900. The data buffer may be in the form of a received data buffer of the sort described above. The decompression block 904 decompresses the extracted data buffer in the manner described above. The processing block 908 processes the decompressed data in a way that ensures that the set of data in the receiving communication entity is the same as the set of data in the transmitting communication entity.

It will be apparent to one skilled in the art that blocks 704, 708, 712, 718, 722, 724, 802, 806, and 808 can be implemented by loading program instruction code to perform their functions on a computing device using a general purpose processor such as an Intel® Pentium® processor or an AMDO Athlon® processor. Alternatively, the blocks 704, 708, 712, 718, 722, 724, 802, 806, and 808 can be implemented using one or more Application Specific Integrated Circuits (ASICs) or Field Programmable Gate Arrays (FPGAs). Various other forms of implementation of the blocks 704, 708, 712, 718, 722, 724, 802, 806, and 808 can be used without deviating from the spirit and scope of the present technique.

It will be also apparent to one skilled in the art that the compression/decompression techniques described above can be embodied in a computer program product using a high-level computer language such as C++, Cobol, Pascal or Visual Basic.

Further, it will be apparent to one skilled in the art that the disclosed compression and decompression techniques are suitable for compressing and decompressing data structures in all applications where the format of the data structure is known to the communication entity performing decompression.

The disclosed method, system and/or computer program product provides for a computationally efficient compression and decompression technique for data structures. The disclosed compression and decompression techniques provide for real-time compression of data structures. Further, the disclosed compression and decompression techniques are suitable for reducing the volume of synchronization data in data communication systems, thereby reducing synchronization time.

Further, the decompression of the data buffer obtained by using the present technique requires prior knowledge of the format of the data structure compressed, as well as the table 402 and the table 502. Therefore, the data structure, which is compressed by using the present technique, is also encrypted. Such encryption does not involve any additional computational cost, and is highly desirable in data communication systems to prevent eavesdropping.

It will be apparent to one skilled in the art that the compression and decompression techniques described above can be used in conjunction with any of the numerous error detection and correction schemes known in the art, without deviating from the spirit and scope of the present technique. Some examples of such error correction schemes are the cyclic redundancy check (CRC) and convolutional coding.

While the preferred embodiments of the technique have been illustrated and described, it will be clear that the technique is not limited to these embodiments only. Numerous modifications, changes, variations, substitutions and equivalents will be apparent to those skilled in the art, without departing from the spirit and scope of the technique as described in the claims.

What is claimed is:

1. A method of communicating data structures among communication entities of a data communication system, the data structures comprising at least one data element, the method comprising:

capturing a current value of the data element pertaining to at least a portion thereof;

encoding the data element by selecting a metadata component characterizing the data element to enable data compression;

updating a data buffer using the metadata component and the portion;

repeating the capturing, the encoding, and the updating for all of the data elements in the data structure;

communicating the data buffer to at least one receiving communication entity in the data communication system;

analyzing the metadata component associated with an encoded data element in the data buffer to obtain a size of the portion;

extracting the portion from the data buffer using the size;

reconstructing the data element from the portion by matching the size of the portion of the data element to the size of the data element; and, repeating the analyzing, the extracting and the reconstructing for all of the encoded data elements in the data buffer.

2. The method according to claim 1, wherein the capturing comprises using all bits from the most significant non-zero bit of the data element to the least significant bit of the data element as the portion and discarding one or more pairs of adjacent zero bits, if any, in bit positions that are more significant than the most significant non-zero bit of the data element.

3. The method according to claim 1, wherein the selecting of the metadata component characterizing the data element comprises:

selecting the size of the metadata component based on the metadata component associated with a data type of the data element; and, evaluating the value of the metadata component based on the current value of the data element.

4. The method according to claim 3, wherein the evaluating value of the metadata component comprises:

identifying a range of data element values from a predefined set of ranges of data element values pertaining to the data type of the data element, wherein the current value of the data element lies within the range; and, selecting a predefined metadata value associated with the identified range as the metadata component value.

5. The method according to claim 3, wherein the data type of each data element in the data structure is known to at least the receiving communication entity prior to the method execution.

6. The method according to claim 3, wherein the data type of each data element in the data structure is communicated to at least the receiving communication entity by another communication entity prior to the method execution.

7. The method according to claim 3, wherein the size of the metadata component for a data element of data type BOOLEAN, SHORT INTEGER, INTEGER, LONG INTEGER or DOUBLE is selected from a group consisting of zero bits, two bits, three bits, and four bits.

8. The method according to claim 1 wherein the updating of the data buffer comprises concatenating the metadata component and the portion to the data buffer.

9. The method according to claim 1, wherein the reconstructing comprises prefixing zeros to the portion to match the size thereof to the size of the data element.

10. The method according to claim 1, wherein the receiving communication entity comprises a redundant server.

11. The method according to claim 1, wherein the data communication system comprises a redundant system.

12. The method according to claim 1, wherein the metadata component indicates the size of the portion.

13. A method of compressing a data structure comprising at least one data element to obtain a data buffer representing the data structure, the method comprising:
    capturing a current value of the data element pertaining to at least a portion thereof;
    encoding the data element by selecting a metadata component characterizing the data element to enable data compression;
    updating the data buffer using the metadata component and the portion; and,
    repeating the capturing, the encoding and the updating for all of the data elements in the data structure.

14. The method according to claim 13, wherein the metadata component indicates the size of the portion.

15. The method according to claim 13, wherein the capturing comprises using all bits from the most significant non-zero bit of the data element to the least significant bit of the data element as the portion and discarding one or more pairs of adjacent zero bits, if any, in bit positions that are more significant than the most significant non-zero bit of the data element.

16. The method according to claim 13, wherein the selecting of the metadata component using a data element comprises:
    selecting a size of the metadata component based on the metadata component associated with the data type of the data element; and,
    evaluating the value of the metadata component based on the current value of the data element.

17. The method according to claim 16, wherein the evaluating of the value of the metadata component comprises:
    identifying a range of data element values from a predefined set of ranges of data element values pertaining to a data type of the data element, wherein the current value of the data element lies within the range; and,
    selecting a predefined metadata value associated with the identified range as the metadata component value.

18. A method of decompressing a data buffer representing a data structure to obtain the data structure, the data buffer comprising at least one encoded data element, each encoded data element representing a data element of the data structure, the method comprising:
    analyzing a metadata component associated with an encoded data element in the data buffer to obtain a size of a portion of the data element represented by the encoded data element;
    extracting the portion from the data buffer by using the size;
    reconstructing the data element from the portion by matching the size of the extracted portion of the data element to the size of the data element; and,
    repeating the analyzing, the extracting and the reconstructing for all of the encoded data elements in the data buffer.

19. A method of communicating data structures in a compressed format for synchronization of the state of communication entities in a data communication system, the data structures comprising at least one data element, the method comprising:
    capturing a current value of the data element by discarding one or more pairs of adjacent zero bits, if any, that occupy bit positions more significant than the most significant non-zero bit of the data element and by retaining the remaining bits of the data element to obtain a portion;
    selecting a size of a metadata component based on the metadata component associated with a data type of the data element;
    identifying a range of data element values from a predefined set of ranges of data element values pertaining to the data type of the data element, wherein the current value of the data element lies within the range;
    selecting a predefined metadata value associated with the identified range as the metadata component value;
    concatenating the metadata component and the portion to the data buffer;
    repeating the capturing, the selecting, the identifying, the selecting, and the concatenating for all of the data elements in the data structure;
    communicating the data buffer to at least one receiving communication entity in the data communication system;
    analyzing the metadata component associated with an encoded data element in the data buffer to obtain a size of the portion;
    extracting the portion from the data buffer using the size of the portion;
    prefixing zeros to the portion to match a size thereof to the size of the data element;
    repeating the analyzing, the extracting, and the prefixing for all of the data elements in the data buffer to reproduce a data structure; and,
    synchronizing the state of the receiving communication entity to the state of a communication entity that communicated the data buffer based on the reproduced data structure.

20. A system for communicating data structures in a compressed format for synchronization of the state of communication entities in a data communication system, the data structures comprising at least one data element, the system comprising:
    a current value capturing block that captures a current value of the data element pertaining to at least one portion thereof, wherein the current value capturing block is adapted to reside in at least one communication entity;

an encoding block that encodes the data element by selecting a metadata component characterizing the data element to enable data compression, wherein the encoding block is adapted to reside in at least one communication entity;

a data buffer updating block that updates a data buffer using the metadata component and the portion, wherein the data buffer updating block is adapted to reside in at least one communication entity;

a communicating block that communicates the data buffer to at least one communication entity in the data communication system, wherein the communicating block is adapted to reside in at least one communication entity;

a metadata component analyzing block that analyzes the metadata component associated with an encoded data element in the data buffer to obtain a size of the portion, wherein the metadata component analyzing block is adapted to reside in at least one communication entity;

a portion extracting block that extracts the portion from the data buffer using the size of the portion, wherein the portion extracting block is adapted to reside in at least one communication entity;

a data element reconstructing block that reconstructs the data element from the portion by matching size of the portion of the data element to the size of the data element, wherein the data element reconstructing block is adapted to reside in at least one communication entity; and, a synchronizing block that synchronizes the state of at least one communication entity using the reconstructed data element.

21. The system according to claim 20, wherein the current value capturing block comprises a bit identifying block that identifies all bits from the most significant non-zero bit of the data element to the least significant bit of the data element.

22. The system according to claim 20, wherein the encoding block comprises:

a size selecting block that selects the size of the metadata component based on the metadata component associated with the data type of the data element, wherein the size selecting block is adapted to reside in at least one communication entity; and, a value evaluating block that evaluates the value of the metadata component based on the current value of the data element, wherein the value evaluating block is adapted to reside in at least one communication entity.

23. The system according to claim 22, wherein the value evaluating block comprises:

a range identifying block that identifies a range of data element values from a predefined set of ranges of data element values pertaining to the data type of the data element, wherein the current value of the data element lies within the range, wherein the range identifying block is adapted to reside in at least one communication entity; and, a predefined metadata value block that selects a predefined metadata value associated with the identified range as the metadata component value, wherein the predefined metadata value block is adapted to reside in at least one communication entity.

24. The system according to claim 20, wherein the data buffer updating block comprises a concatenating block that concatenates the metadata component and the portion to the data buffer.

25. The system according to claim 20, wherein the data element reconstructing block comprises a zero prefixing block that prefixes zeros to the portion of the data element to match size thereof to the size of the data element.

26. The system according to claim 20, wherein at least one of the communication entities comprises a redundant server.

27. The method according to claim 20, wherein the data communication system comprises a redundant system.

28. A system for compressing a data structure comprising at least one data element to obtain a data buffer representing the data structure, the system comprising:

a current value capturing block that captures a current value of the data element pertaining to at least one portion thereof, wherein the current value capturing block is adapted to reside in at least one communication entity;

a data element encoding block that encodes the data element by selecting a metadata component characterizing the data element to enable data compression, wherein the data element encoding block is adapted to reside in at least one communication entity; and, a data buffer updating block that updates the data buffer using the metadata component and the portion, wherein the data buffer updating block is adapted to reside in at least one communication entity.

29. A system for decompressing a data buffer representing a data structure to obtain the data structure, the data buffer comprising at least one encoded data element, each encoded data element representing a data element of the data structure, the system comprising:

a metadata component analyzing block that analyzes a metadata component associated with an encoded data element in the data buffer to obtain a size of a portion of the data element represented by the encoded data element, wherein the metadata component analyzing block is adapted to reside in at least one communication entity;

a data element extracting block that extracts the portion of the data element from the data buffer using the size, wherein the data element extracting block is adapted to reside in at least one communication entity; and, a data element reconstructing block that reconstructs the data element from the portion by matching size of the portion of the data element to the size of the data element, wherein the data element reconstructing block is adapted to reside in at least one communication entity.

30. A computer readable medium having program stored thereon code, wherein the program code, when executed, communicates data structures in a compressed format to a communication entity in a data communication system, the data structures comprising at least one data element, the program code comprising:

first program code that captures a current value of the data element pertaining to at least one portion thereof;

second program code that encodes the data element by selecting a metadata component characterizing the data element to enable data compression;

third program code that updates a data buffer using the metadata component and the portion; and, fourth program code that communicates the data buffer to at least one receiving communication entity in the data communication system.

31. The computer readable medium according to claim 30, wherein the first program code comprises fifth program code that identifies all bits from the most significant non-zero bit of the data element to the least significant bit of the data element.

32. The computer readable medium according to claim 30, wherein the second program code comprises:
    fifth program code that selects the size of the metadata component based on the metadata component associated with the data type of the data element; and,
    sixth program code that evaluates the value of the metadata component based on the current value of the data element.

33. The computer readable medium according to claim 32, wherein the sixth program code comprises:
    seventh program code that identifies a range of data element values from a predefined set of ranges of data element values pertaining to the data type of the data element, wherein the current value of the data element lies within the range; and,
    eighth program code that selects a predefined metadata value associated with the identified range as the metadata component value.

34. A computer readable medium having program stored thereon code, wherein the program code, when executed, decompresses a data buffer corresponding to a data structure in a compressed format, the data buffer comprising a portion of a data element of the data structure and a metadata component corresponding to the portion, the program code comprising:
    first program code that analyzes the metadata component associated with the portion to obtain a size of the portion;
    second program code that extracts the portion from the data buffer using the size of the portion; and,
    third program code that reconstructs the data element from the portion by matching size of the portion of the data element to the size of the data element.

35. The computer readable medium according to claim 34, wherein the third program code comprises fourth program code that prefixing zeros to the portion to match the size thereof to the size of the data element.

* * * * *